(12) United States Patent
Spigelmyer et al.

(10) Patent No.: US 9,257,629 B2
(45) Date of Patent: *Feb. 9, 2016

(54) ULTRASONIC ARRAY TRANSDUCER, ASSOCIATED CIRCUIT AND METHODS OF MAKING THE SAME

(75) Inventors: Matthew Todd Spigelmyer, Spring Mills, PA (US); Derek Ryan Greenaway, Howard, PA (US)

(73) Assignee: TransducerWorks, LLC, Centre Hall, PA (US)

( * ) Notice: Subject to any disclaimer, the term of this patent is extended or adjusted under 35 U.S.C. 154(b) by 362 days.

This patent is subject to a terminal disclaimer.

(21) Appl. No.: 13/519,980

(22) PCT Filed: Jul. 21, 2011

(86) PCT No.: PCT/US2011/044818
§ 371 (c)(1),
(2), (4) Date: Nov. 14, 2012

(87) PCT Pub. No.: WO2012/012615
PCT Pub. Date: Jan. 26, 2012

(65) Prior Publication Data
US 2013/0113336 A1    May 9, 2013

Related U.S. Application Data

(63) Continuation-in-part of application No. 12/841,165, filed on Jul. 21, 2010, now Pat. No. 8,299,687.

(51) Int. Cl.
*H01L 41/047* (2006.01)
*B06B 1/02* (2006.01)
*H05K 1/18* (2006.01)
*H01L 41/29* (2013.01)
*H01L 41/338* (2013.01)

(52) U.S. Cl.
CPC .......... *H01L 41/0475* (2013.01); *B06B 1/0292* (2013.01); *H01L 41/29* (2013.01); *H01L 41/338* (2013.01); *H05K 1/189* (2013.01); *H05K 2201/10083* (2013.01); *Y10T 29/42* (2015.01)

(58) Field of Classification Search
CPC ..... B06B 1/0292; H01L 41/29; H01L 41/338; H05K 1/189; H05K 2201/10083
USPC .......... 310/314, 365, 348, 334, 327, 366, 322
IPC ............................. H01L 41/047, 41/29, 41/338
See application file for complete search history.

(56) References Cited

U.S. PATENT DOCUMENTS

| 6,747,400 B2 * | 6/2004 | Maichl et al. ................. 310/332 |
| 7,275,298 B2 * | 10/2007 | Schindel ...................... 310/334 |
| 8,299,687 B2 * | 10/2012 | Spigelmyer et al. .......... 310/348 |
| 2009/0122651 A1 | 5/2009 | Kupnik et al. |

FOREIGN PATENT DOCUMENTS

| EP | 1810619 A1 | 7/2007 |
| WO | 03/035281 A2 | 5/2003 |
| WO | 2009/139400 A1 | 11/2009 |

OTHER PUBLICATIONS

International Search Report and Written Opinion mailed Dec. 29, 2011 for PCT/US2011/044818, 11 pages.

* cited by examiner

*Primary Examiner* — Thomas Dougherty
*Assistant Examiner* — Karen B Addison
(74) *Attorney, Agent, or Firm* — Smith Moore Leatherwood LLP; J. Clinton Wimbish

(57) ABSTRACT

In some embodiments, circuits for ultrasonic transducer element arrays are provided. In some embodiments, a circuit described herein comprises a first layer for receiving a transducer element array, a ground layer comprising at least one ground disposed over the first layer and a plurality of first vias corresponding to transducer elements of the array, the first vias extending through the first layer to the at least one ground and comprising first ends for receiving ground electrodes of the transducer elements and second ends electrically connected to the ground.

10 Claims, 8 Drawing Sheets

ULTRASONIC ARRAY TRANSDUCER, ASSOCIATED CIRCUIT AND METHODS OF MAKING THE SAME

RELATED APPLICATION DATA

The present application is a national stage application under 35 U.S.C. 371 of International Application No. PCT/US2011/044818 filed 21 Jul. 2011, which is a continuation-in-part of U.S. patent application Ser. No. 12/841,165, filed Jul. 21, 2010, now U.S. Pat. No. 8,299,687, which are each hereby incorporated by reference in their entirety.

FIELD

Embodiments relate in general to transducers and, more particularly, to ultrasonic array transducers.

BACKGROUND

There are a number of ways in which an ultrasonic transducer can be made. One manufacturing approach will be described in connection with FIG. 1. A monolithic block of piezoelectric ceramic material 10 is provided. A portion of the piezoelectric material 10 is covered by a plating material 12 wrapped therearound. Deactivation cuts 14 are made along a top surface of the plating material 12 to define a positive electrode 16 and a ground electrode 18. The deactivation cuts 14 extend into and out of the page in FIG. 1. The positive electrode 16 is formed by that portion of the plating material 12 located between the two deactivation cuts 14. The ground electrode 18 is formed by the plating material 12 outside of the two deactivation cuts 14. With the use of a wrap around plating material 12, electrical connections to the positive and ground electrodes 16, 18 can be easily made on the same surface of the piezoelectric material 10. The block of piezoelectric ceramic material 10 and the plating material 12 with the deactivation cuts 14 form a piezoelectric material/electrode assembly 24.

A flexible circuit 22 is disposed on the top of the piezoelectric material/electrode assembly 24. Electrical connections are made between individual traces of the flexible circuit 22 and the positive and ground electrodes 16, 18 in locations of each intended transducer element. For instance, wires can be soldered onto the positive and ground electrodes 16, 18 and attached to individual traces of the flexible circuit 22. A solid backer 26 is bonded to the top side of the piezoelectric material/electrode assembly 24 with the flexible circuit 22 sandwiched therebetween. One or more matching layers 28 are then attached to the bottom side of the piezoelectric material/electrode assembly 24.

A plurality of individual transducer elements are formed using a dicing saw 30 to make a plurality of parallel dices or cuts in the assembly. The dicing saw 30 is brought into contact with the assembly from the patient side of the assembly, that is, from the matching layer 28 side of the assembly. Thus, the dicing saw 30 cuts through the one or more matching layers 28, through the plating material 12, through the piezoelectric material 10, through the flexible circuit 22 and into a portion of the backer 26. A plurality of transducer elements are developed by the dicing operation. The cuts formed by the dicing saw 30 can extend in a direction that is perpendicular to the direction in which the deactivation cuts 14 extend.

The undiced portion of the backer 26 holds the diced assembly together. After the dicing operation, kerf filler can be placed in the cuts to provide structural support to the diced assembly. The kerf filler can also provide some degree of acoustic isolation between the transducer elements.

However, when dices are made in the assembly, the common ground electrode 18 is severed, and a plurality of individual ground electrodes is formed. The individual ground electrodes must be reconnected. Typically, a wire is soldered across the individual ground electrodes to reconnect the ground electrodes. This process is labor intensive and time consuming. Further, the heat from the soldering process can depolarize the piezoelectric material 10, thereby adversely affecting the performance of the transducer.

SUMMARY

In one aspect, circuits for transducer element arrays are described herein which, in some embodiments, may assist in mitigating one or more disadvantages associated with individual ground electrode reconnection. In some embodiments, circuits described herein are flexible circuits. In some embodiments, a circuit described herein comprises a first layer for receiving a transducer element array, a ground layer comprising at least one ground disposed over the first layer and a plurality of first vias corresponding to transducer elements of the array, the first vias extending through the first layer to the at least one ground and comprising first ends for receiving ground electrodes of the transducer elements and second ends electrically connected to the ground.

In some embodiments, the ground layer comprises a plurality of grounds for interfacing with ground electrodes of transducer elements through the first vias. In being disposed over the first layer, the ground layer, in some embodiments, is adjacent to the first layer. Alternatively, in some embodiments, one or more additional layers are disposed between the first layer and the ground layer. In some embodiments wherein one or more additional layers are disposed between the first layer and the ground layer, the first vias extend through the first layer and the one or more additional layers to the ground(s) of the ground layer.

Moreover, in some embodiments, a circuit described further herein comprises one or more ground vias for electrically connecting one or more grounds of the ground layer to an external circuit, such as that of an ultrasound system. In some embodiments, a ground via extends through the ground layer to the exterior of the circuit. In some embodiments, for example, a ground via extends laterally out of the ground layer. In some embodiments, a ground via extends into one or more layers adjacent to the ground layer.

A circuit described herein, in some embodiments, further comprises second vias corresponding to transducer elements of the array, the second vias extending through the first layer and comprising first ends for receiving positive electrodes of the transducer elements and second ends electrically connected to traces in electrical communication with circuitry external to the circuit, such as that of an ultrasound system. In some embodiments, at least some of the second vias terminate in one or more additional layers disposed between the first layer and the ground layer. In some embodiments, at least some of the second vias terminate in one or more additional layers disposed over the ground layer. In some embodiments, at least some of the second vias terminate in the ground layer. In some embodiments, a first number of second vias terminate in a different layer of the circuit than a second number of second vias.

In another aspect, ultrasonic transducer systems are described herein. In some embodiments, an ultrasonic transducer system comprises an array comprising a plurality of transducer elements, the transducer elements comprising individual positive electrodes and ground electrodes and a circuit coupled to the array, the circuit comprising a first layer for receiving the array, a ground layer comprising at least one ground disposed over the first layer and a plurality of first vias corresponding to transducer elements of the array, the first vias extending through the first layer to the at least one ground and comprising first ends electrically connected to individual ground electrodes of the transducer elements and second ends electrically connected to the ground of the ground layer.

In some embodiments, a circuit of an ultrasonic transducer system described herein further comprises one or more ground vias for electrically connecting one or more grounds of the ground layer to an external circuit, such as that of an ultrasound system. In some embodiments, a ground via extends through the ground layer to the exterior of the circuit. In some embodiments, for example, a ground via extends laterally out of the ground layer. Moreover, in some embodiments, a ground via extends into one or more layers adjacent to the ground layer.

A circuit of an ultrasonic transducer system, in some embodiments, further comprises second vias corresponding to transducer elements of the array, the second vias extending through the first layer and comprising first ends electrically connected to positive electrodes of the transducer elements and second ends electrically connected to one or more traces in electrical communication with an ultrasound system. In some embodiments, at least one second via is associated with a positive electrode of each transducer element of the array.

In some embodiments, at least some of the second vias terminate in one or more additional layers disposed between the first layer and the ground layer of the circuit. In some embodiments, at least some of the second vias terminate in one or more additional layers disposed over the ground layer. In some embodiments, at least some of the second vias terminate in the ground layer. In some embodiments, a first number of second vias terminate in a different layer of the circuit than a second number of second vias.

As illustrated in the Figures of the present application, an ultrasonic transducer system described herein can have an associated axial direction A, a longitudinal direction L that is transverse to the axial direction A, and a thickness direction T. In some embodiments, a transducer element array of an ultrasonic transducer system described herein comprises a piezoelectric material separated into N transducer elements in the axial direction to provide an N×1 array. In some embodiments, a transducer element array of an ultrasonic transducer system comprises a piezoelectric material separated into N transducer groups in the axial direction and M transducer elements in the longitudinal direction transverse to the axial direction to provide an N×M array. In some embodiments, a transducer element array of an ultrasonic transducer system described herein is a curved array. In some embodiments, a transducer element array of an ultrasonic transducer system described herein is a planar array.

In another aspect, methods of making transducer assemblies are described herein. In some embodiments, a method of making a transducer assembly comprises providing a piezoelectric element partially covered with a plating material defining a ground electrode and at least one positive electrode and providing a circuit comprising a first layer for receiving the piezoelectric element, a ground layer comprising at least one ground disposed over the first layer and a plurality of first vias extending through the first layer to the at least one ground and comprising first ends for receiving the ground electrode of the piezoelectric element and second ends electrically connected to the at least one ground. The first layer of the circuit is interfaced with the piezoelectric element and the first ends of the first vias are placed in electrical communication with the ground electrode of the piezoelectric element. A plurality of cuts are made in the piezoelectric element having a depth passing through the piezoelectric element, plating material and first layer of the circuit and terminating prior to reaching the ground of the ground layer. The cuts provide separated transducer elements in the axial direction, the transducer elements comprising individual ground electrodes and positive electrodes, wherein the individual ground electrodes are connected to one another through the first vias in electrical communication with the at least one ground, thereby obviating the need to reconnect the ground electrodes with further processing subsequent to the dicing operation.

In some embodiments of methods of making a transducer assembly described herein, the piezoelectric element is provided with a plurality of cuts in the axial direction, the cuts terminating prior to the ground electrode on the opposing side of the piezoelectric element and providing M separated transducer elements in the longitudinal direction transverse to the axial direction. In some embodiments wherein the piezoelectric element is provided with M separated transducer elements in the longitudinal direction, the cuts made in the piezoelectric element having a depth passing through the piezoelectric element, plating material and first layer of the circuit and terminating prior to reaching the ground of the ground layer, provide in the axial direction N separated groups of the M transducer elements, thereby providing an N×M array.

These and other embodiments are described in greater detail in the detailed description which follows.

DETAILED DESCRIPTION

Figure 1:
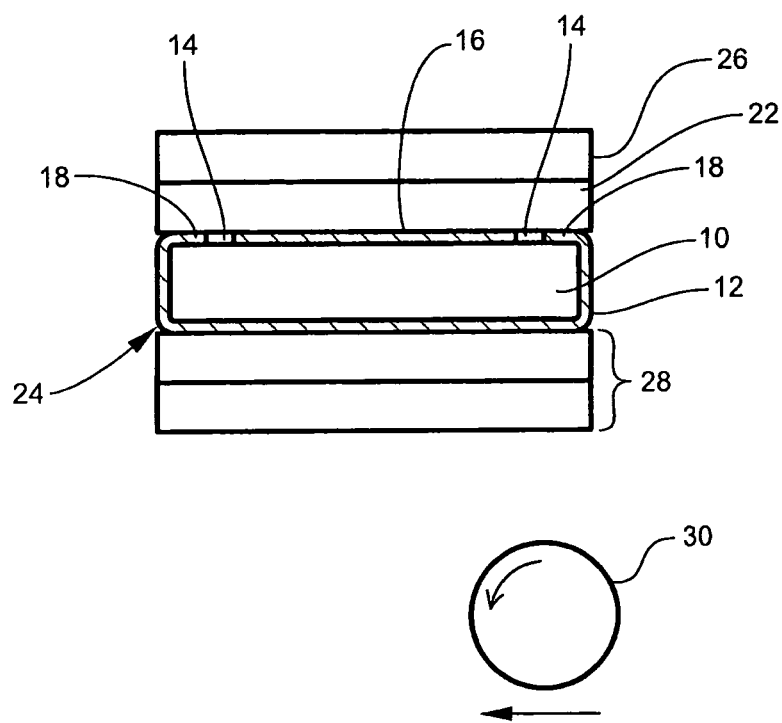
FIG. 1 illustrates a prior art method of making an ultrasonic transducer system.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, circuits for transducer element arrays are described herein. In some embodiments, circuits described herein are flexible circuits. In some embodiments, circuits for transducer element arrays described herein permit facile connection of ground electrodes of transducer elements formed by one or more dicing operations.

In some embodiments, a circuit described herein comprises a first layer for receiving a transducer element array, a ground layer comprising at least one ground disposed over the first layer and a plurality of first vias corresponding to transducer elements of the array, the first vias extending through the first layer to the at least one ground and comprising first ends for receiving ground electrodes of the transducer elements and second ends electrically connected to the ground.

The term "via" denotes a construction comprising an accessway through one or more layers of a circuit described herein, the accessway comprising any suitable element for establishing electrical connection between electrically conducting elements within different layers of the circuit and/or with one or more electrical conductors external to the circuit. In some embodiments, the vias can be pads with plated holes, which can be made to be conductive by electroplating, or the holes can be filled with annular rings or rivets. Embodiments described herein are not limited to any particular type of via.

In some embodiments, a circuit described herein further comprises one or more ground vias for electrically connecting one or more grounds of the ground layer to an external circuit, such as that of an ultrasound system. In some embodiments, a ground via extends through the ground layer to the exterior of the circuit. In some embodiments, for example, a ground via extends laterally out of the ground layer. In some embodiments, a ground via extends into one or more layers adjacent to the ground layer.

A circuit described herein, in some embodiments, further comprises second vias corresponding to transducer elements of the array, the second vias extending through the first layer and comprising first ends electrically coupled to positive electrodes of the transducer elements and second ends electrically connected to one or more traces in electrical communication with circuitry external to the circuit, such as that of an ultrasound system. In some embodiments, at least one second via is associated with a positive electrode of each transducer element of the array.

In some embodiments, at least some of the second vias terminate in one or more additional layers disposed between the first layer and the ground layer of the circuit. In some embodiments, at least some of the second vias terminate in one or more additional layers disposed over the ground layer. In some embodiments, at least some of the second vias terminate in the ground layer. In some embodiments, a first number of second vias terminate in a different layer of the circuit than a second number of second vias.

In some embodiments, layers of a circuit described herein can be constructed from any desired material not inconsistent with the objectives of the present invention. In some embodiments, layers of a circuit described herein are constructed of flexible materials to provide a flexible circuit. In some embodiments, layers of a circuit described herein comprise one or more flexible dielectric polymeric materials. In some embodiments, a suitable flexible dielectric polymeric material comprises one or more polyimides. In some embodiments, for example, one or more layers of a circuit described herein comprise KAPTON® polyimide commercially available from DuPont of Wilmington, Del. Alternatively, in some embodiments, layers of a circuit described herein are constructed of one or more rigid or semi-rigid dielectric polymeric materials.

In some embodiments, a circuit described herein is suitable for interfacing with a transducer element array comprising a piezoelectric material separated into N transducer elements in the axial direction to provide an N×1 array. In some embodiments, N is 64 or a multiple of 64. In some embodiments, for example, N is 128, 192, 256, 320, 384, 448 or 512. In some embodiments, N is 96.

In some embodiments, a circuit described herein is suitable for interfacing with a transducer element array comprising a piezoelectric material separated into N transducer groups in the axial direction and M transducer elements in the longitudinal direction transverse to the axial direction to provide an N×M array. In some embodiments, N of an N×M array is 64 or a multiple of 64, including 128, 192, 256, 320, 384, 448 or 512. In some embodiments, N of an N×M array is greater than 512. In some embodiments, N of an N×M array described herein is 96. Moreover, in some embodiments M of an N×M array is selected from the group consisting of 3, 5, 7, 9 and 11. In some embodiments, a circuit described herein is suitable for interfacing with a transducer element array having an N×M construction according to Table I.

TABLE I

| Transducer Arrays N × M Transducer Array |
|---|
| 64 × 1, 3, 5, 7, 9 or 11 |
| 96 × 1, 3, 5, 7, 9 or 11 |
| 128 × 1, 3, 5, 7, 9 or 11 |
| 192 × 1, 3, 5, 7, 9 or 11 |
| 256 × 1, 3, 5, 7, 9 or 11 |
| 320 × 1, 3, 5, 7, 9 or 11 |
| 384 × 1, 3, 5, 7, 9 or 11 |
| 448 × 1, 3, 5, 7, 9 or 11 |
| 512 × 1, 3, 5, 7, 9 or 11 |

In some embodiments, a transducer element array interfacing with a circuit described herein is a curved array. In some embodiments, a transducer element array interfacing with a circuit described herein is a tightly curved array. In some embodiments, a circuit described herein is suitable for interfacing with a curved array or tightly curved array having any transducer element arrangement provided in Table I herein. In some embodiments, for example, a circuit described herein is suitable for interfacing with a curved array or a tightly curved array having transducer element arrangement of 192×5 or 256×5.

In some embodiments, a transducer element array of an ultrasonic transducer system described herein is a planar array.

In another aspect, ultrasonic transducer systems are described herein. In some embodiments, an ultrasonic transducer system comprises an array comprising a plurality of transducer elements, the transducer elements comprising individual positive electrodes and ground electrodes and a circuit coupled to the array, the circuit comprising a first layer for receiving the array, a ground layer comprising at least one ground disposed over the first layer and a plurality of first vias corresponding to transducer elements of the array, the first vias extending through the first layer to the at least one ground and comprising first ends electrically connected to individual ground electrodes of the transducer elements and second ends electrically connected to the ground of the ground layer. In some embodiments, a circuit of an ultrasonic transducer system described herein further comprises one or more ground vias for electrically connecting one or more grounds of the ground layer to an external circuit, such as that of an ultrasound system.

A circuit of an ultrasonic transducer system, in some embodiments, further comprises second vias corresponding to transducer elements of the array, the second vias extending through the first layer and comprising first ends electrically connected to positive electrodes of the transducer elements and second ends electrically connected to one or more traces in electrical communication with an ultrasound system. In some embodiments, at least one second via is associated with a positive electrode of each transducer element of the array.

In some embodiments, at least some of the second vias terminate in one or more additional layers disposed between the first layer and the ground layer of the circuit. In some embodiments, at least some of the second vias terminate in one or more additional layers disposed over the ground layer. In some embodiments, at least some of the second vias terminate in the ground layer. In some embodiments, a first number of second vias terminate in a different layer of the circuit than a second number of second vias.

In some embodiments, a transducer element array of an ultrasonic transducer system comprises a piezoelectric material separated into N transducer elements in the axial direction to provide an N×1 array. In some embodiments, a transducer element array of an ultrasonic transducer system comprises a piezoelectric material separated into N transducer groups in the axial direction and M transducer elements in the longitudinal direction transverse to the axial direction to provide an N×M array.

In some embodiments, a transducer element array of an ultrasonic transducer system described herein is a curved array. In some embodiments, a transducer element array of an ultrasonic system described herein is a tightly curved array. In some embodiments, a transducer element array of an ultrasonic transducer system described herein is a planar array. In some embodiments, a transducer element array of an ultrasonic transducer system has a transducer element arrangement selected from the arrangements provided in Table I.

Figure 2:
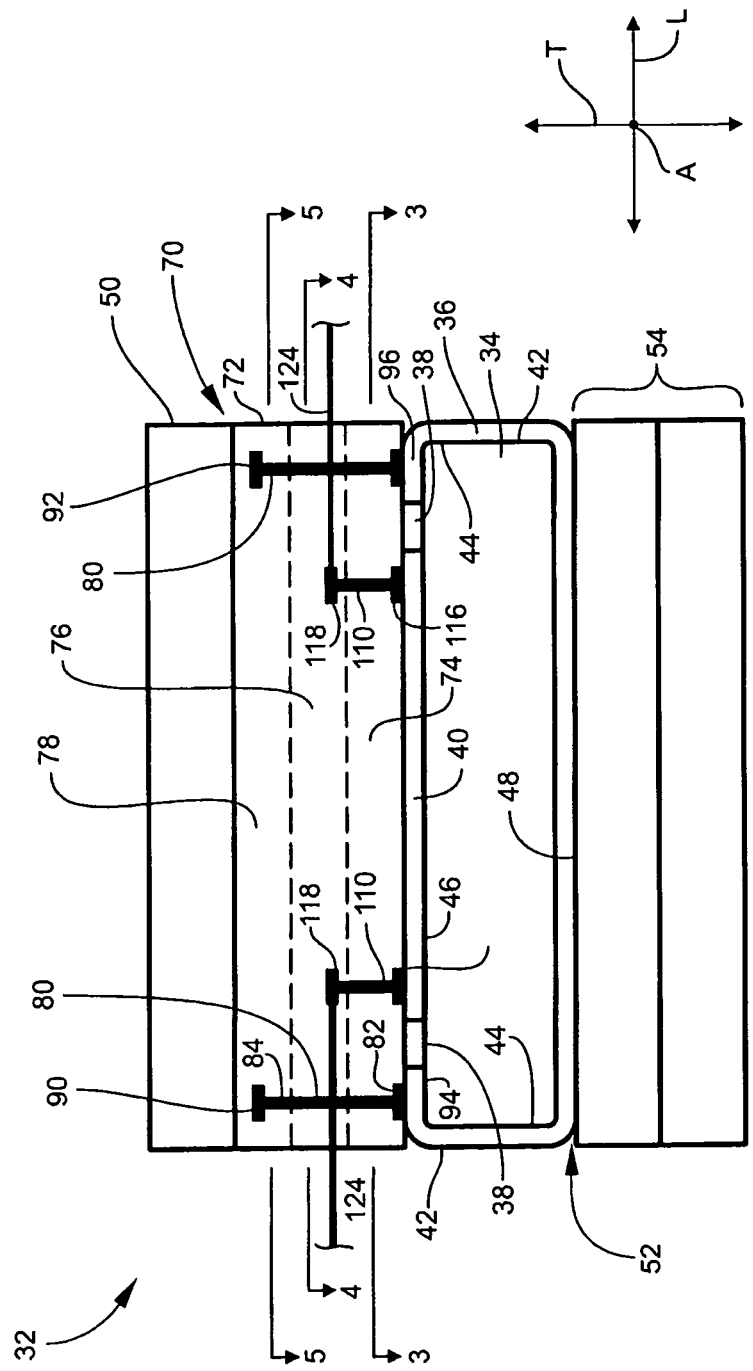
FIG. 2 is a side elevation cross-sectional view of a transducer system according to one embodiment described herein.

FIG. 2 is a side elevation cross-sectional view of an ultrasonic transducer system according to one embodiment described herein. The ultrasonic transducer system 32 of FIG. 2 comprises an N×1 transducer element array 34 comprising a plurality of transducer elements 56, the transducer elements comprising a piezoelectric ceramic material. As FIG. 2 is a side elevation cross-sectional view of the transducer system 32, the cross-section of a single transducer element 56 of the array 34 in conjunction with the section of the circuit 70 associated with the transducer element 56 is shown. The remaining transducer elements 56 of the array 34 and associated circuitry 70 having a similar construction extend along the axial direction. The transducer element 56 comprises an electrically conductive plating material 36 wrapped therearound. The plating material 36 is discontinuous at regions 38 to define a positive electrode 40 and ground electrode 42 of the transducer element 56. Discontinuous regions 38 can be formed by a variety of processes including making deactivation cuts to remove the plating material 36 or etching the plating material 36 chemically and/or lithographically. In some embodiments, discontinuous regions 38 are provided by selectively depositing the plating material 36 on the transducer element 56. Selective deposition of the plating material 36, in some embodiments, is achieved by masking and/or other lithographic techniques, chemical etching and/or ion etching techniques.

The ground electrode 42 can extend about a portion of an upper side 46 of the transducer element 56, over side walls 44 and across a lower side 48 of the transducer element 56. The terms "upper" and "lower" are used for convenience to facilitate the discussion and are not meant to be limiting. Additionally, one or more acoustic matching layers 54 are coupled to one side of the transducer element array 34.

The ultrasonic transducer system 32 of FIG. 2 also comprises a circuit 70 interfaced with the transducer element array 34. As with the transducer element array 34, the circuit 70 has an associated axial direction A, a longitudinal direction L that is transverse to the axial direction A, and a thickness direction T.

In the embodiment of FIG. 2, the circuit 70 comprises a first layer 74 for receiving or interfacing with the transducer element array 34 and a ground layer 78 over the first layer 74, the ground layer comprising a first ground 90 and a second ground 92. Although two grounds 90, 92 are illustrated in the embodiment of FIG. 2, circuits comprising a single ground or more than two grounds in the ground layer are contemplated herein. At least one additional layer 76 is disposed between the first layer 74 and the ground layer 78. In the embodiment of FIG. 2, a backer 50 is coupled to the circuit 70 and can provide structural rigidity to the circuit 70.

In some embodiments, at least one of the first 90 and second 92 grounds is provided on an exterior surface of the ground layer 78, as opposed to within the ground layer 78. In some embodiments, for example, at least one of the first 90 and second 92 grounds is disposed on the exterior surface of the ground layer 78 interfacing with the at least one additional layer 76. In some embodiments, at least one of the first 90 and second 92 grounds is disposed on the exterior surface of the ground layer interfacing with the backer 50.

The circuit 70 comprises first vias 80 extending through the first layer 74 and the at least one additional layer 76 to the first 90 and second 92 grounds of the ground layer 78. The first vias 80 comprise first ends 82 electrically connected to the ground electrode 42 of transducer elements 56 of the array 34 and second ends 84 electrically connected to the first 90 or second ground 92. Although two first vias 80 and two grounds 90, 92 are illustrated in FIG. 2, embodiments described herein contemplate use of a single via 80 in the circuit 70 to electrically connect the ground electrode 42 of transducer element 56 to a single ground 90 of the ground layer 78.

Moreover, in the embodiment illustrated in FIG. 2, first vias 80 extend in a vertical direction normal to layers of the circuit 70. In some embodiments, first vias 80 can extend at one or more angles non-normal to layers of the circuit 70. In some embodiments, first vias 80 can extend laterally through one more layers of the circuit 70 in additional to vertically.

The circuit 70 illustrated in FIG. 2 further comprises second vias 110 extending through the first layer 74. The second vias 110 comprise first ends 116 electrically connected to the positive electrode 40 of the transducer element 56. The second vias 110 terminate in the at least one additional layer 76, and the second ends 118 of the second vias are electrically connected to conductors or traces 124 in electrical communication with external circuitry, such as that of an ultrasound system. As described herein, the second vias can pass through the first layer and terminate in any layer over the first layer. In the embodiment of FIG. 2, for example, the first vias 110 can also terminate in the ground layer 78. In some embodiments, a first number of second vias terminate in a different layer of the circuit than a second number of the second vias.

In the embodiment of FIG. 2, the conductors or traces 124 extend in the longitudinal direction (L) of the circuit 70 to the exterior of the at least one additional layer 76 where the traces 124 can be electrically connected to external circuitry, such as that of an ultrasound system. Although two second vias 110 are illustrated in FIG. 2, embodiments described herein contemplate use of a single second via 110 in the circuit 70 to electrically connect the positive electrode 40 to external circuitry through one or more conductors or traces 124.

Figure 3:
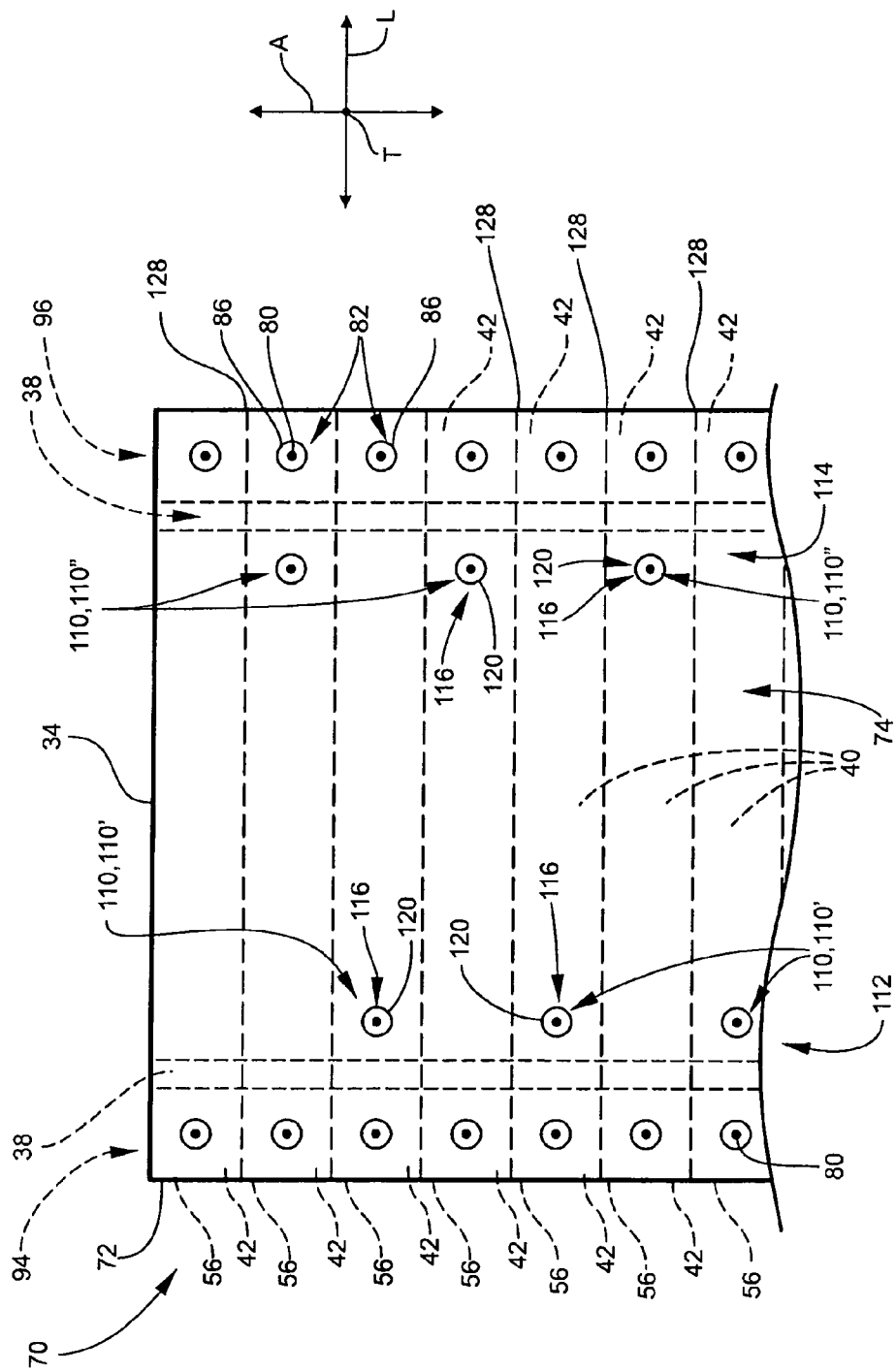
FIG. 3 is a top plan cross-sectional view of a first layer of one embodiment of a circuit described herein, viewed along line 3-3 in FIG. 2.

FIG. 3 is a top plan cross-sectional view of the first layer 74 of the circuit 70 of FIG. 2 viewed along line 3-3 in FIG. 2. Individual transducer elements 56 of the N×1 transducer element array 34 defined by cuts 128 in the longitudinal direction of the piezoelectric ceramic material would be occluded by the first layer 74 in the presently illustrated view but are shown for reference purposes. Similarly, ground electrodes 42, positive electrodes 40 and discontinuous regions 38 would also be occluded by the first layer 74, but are shown for reference purposes.

A plurality of first vias 80 can extend through the first layer 74, through the at least one additional layer 76 and into the ground layer 78. The plurality of first vias 80 can be formed in the circuit 70 such that each of the first vias 80 can be outboard of the discontinuous regions 38. In other words, each of the plurality of first vias 80 can be aligned with a respective one of the ground electrodes 42 of the transducer elements 56 when the circuit 70 is disposed on the transducer element array 34, as shown in FIG. 3

In some embodiments, there can be at least two first vias 80 associated with each transducer element 56. For example, one of the first vias 80 can be associated with a first longitudinal end portion 94 of the ground electrode 42, and another one of the first vias 80 can be associated with a second longitudinal end portion 96 of the ground electrode 42. The first vias 80 can be substantially aligned in the axial direction A along the first and second longitudinal end portions 94, 96 of the ground electrodes 42, as is shown in FIG. 3. While not shown in FIG. 3, one or more of the first vias 80 can be offset from the other first vias 80 in the axial direction A.

As in FIG. 2, each of the plurality of first vias 80 can have a first end 82 and a second end 84. The first ends 82 of the first vias 80 can be adapted to facilitate operative connection to the ground electrodes 42 of the transducer elements 56. In some embodiments, for example, the first ends 82 of the first vias 80 can include connection pads 86. The second ends 84 of the first vias 80 can terminate within or external to the ground layer 78. The second ends 84 of the first vias 80 can be adapted to facilitate operative connection to one or more of grounds in the ground layer 78. In some embodiments, for example, the second ends 84 of the first vias 80 can include connection pads.

Figure 5:
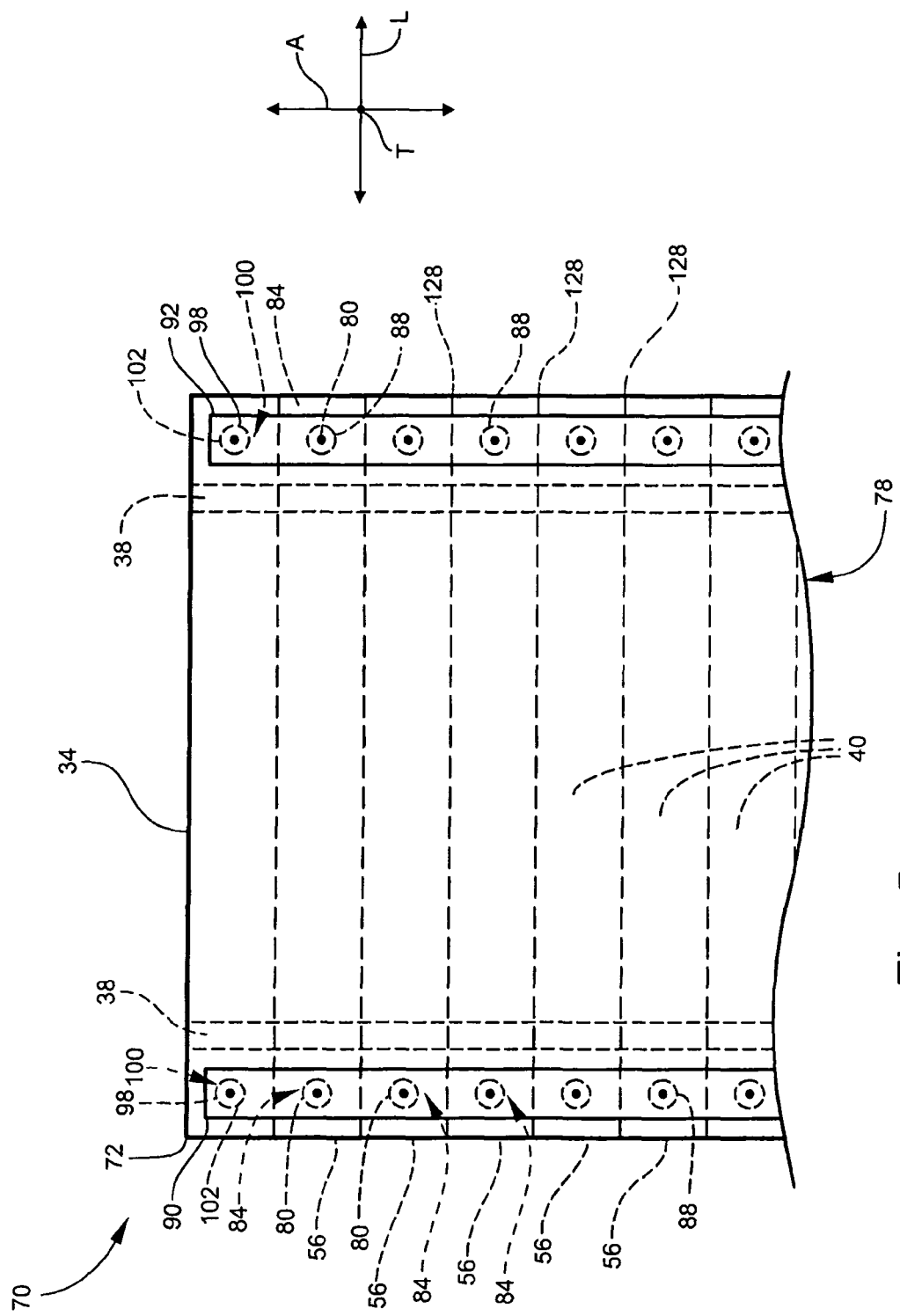
FIG. 5 is a top plan cross-sectional view of a ground layer of one embodiment of a circuit described herein, viewed along line 5-5 in FIG. 2.

FIG. 5 is a top plan cross-sectional view of the ground layer 78 of the circuit 70 of FIG. 2, as viewed in the direction of the arrows associated with line 5-5 in FIG. 2. Individual transducer elements 56 of the N×1 transducer element array 34 defined by cuts 128 in the longitudinal direction of the piezoelectric ceramic material would be occluded by the ground layer 78 in the presently illustrated view but are shown for reference purposes. Similarly, discontinuous regions 38 in the plating material 36 would also be occluded by the ground layer 78, but are shown for reference purposes.

The ground layer 78 can include one or more different traces, including, for example, a first ground 90 and a second ground 92. The first and second grounds 90, 92 can provide a common return path for signals in the circuit 70. The first and second grounds 90, 92 can be elongated continuous conductors. The first and second grounds 90, 92 can be made of any suitable material and have any desired shape not inconsistent with the objectives of the present invention. In some embodiments, the first and second grounds 90, 92 can be substantially parallel to each other. The first and second grounds 90, 92, in some embodiments, can extend in generally the axial direction A. As described herein, the second ends 84 of the first vias 80 can be operatively connected to a respective one of the grounds 90, 92. The term "operatively connected," as used herein, can include direct and indirect connections.

Some of the plurality of first vias 80 can be united at the first ground 90, and some of the plurality of first vias 80 can be united at the second ground 92. The first and second grounds 90, 92 can be taken outside the circuit 70. To that end, there can be a ground via 98 associated with each of the grounds 90, 92. The ground vias 98 are different from the first vias 80. For instance, as will be explained in more detail below, the first vias 80 operatively connect the ground electrodes 42 of individual transducer elements 56 to a respective one of the grounds 90, 92 whereas the ground vias 98 operatively connect at least one of the grounds 90, 92 to a conductor extending outside of the circuit 70.

A ground via 98 can be operatively connected at a first end 100 to a respective ground 90, 92. The first end 100 may include a connection pad 102 or other suitable structure to facilitate operative connection. In some embodiments, a ground via 98 can extend from the ground layer 78 and into at least one additional layer 76 disposed between the ground layer 78 and the first layer 74. Alternatively, in some embodiments, a ground via 98 can extend laterally or vertically out of the ground layer 78.

Figure 4:
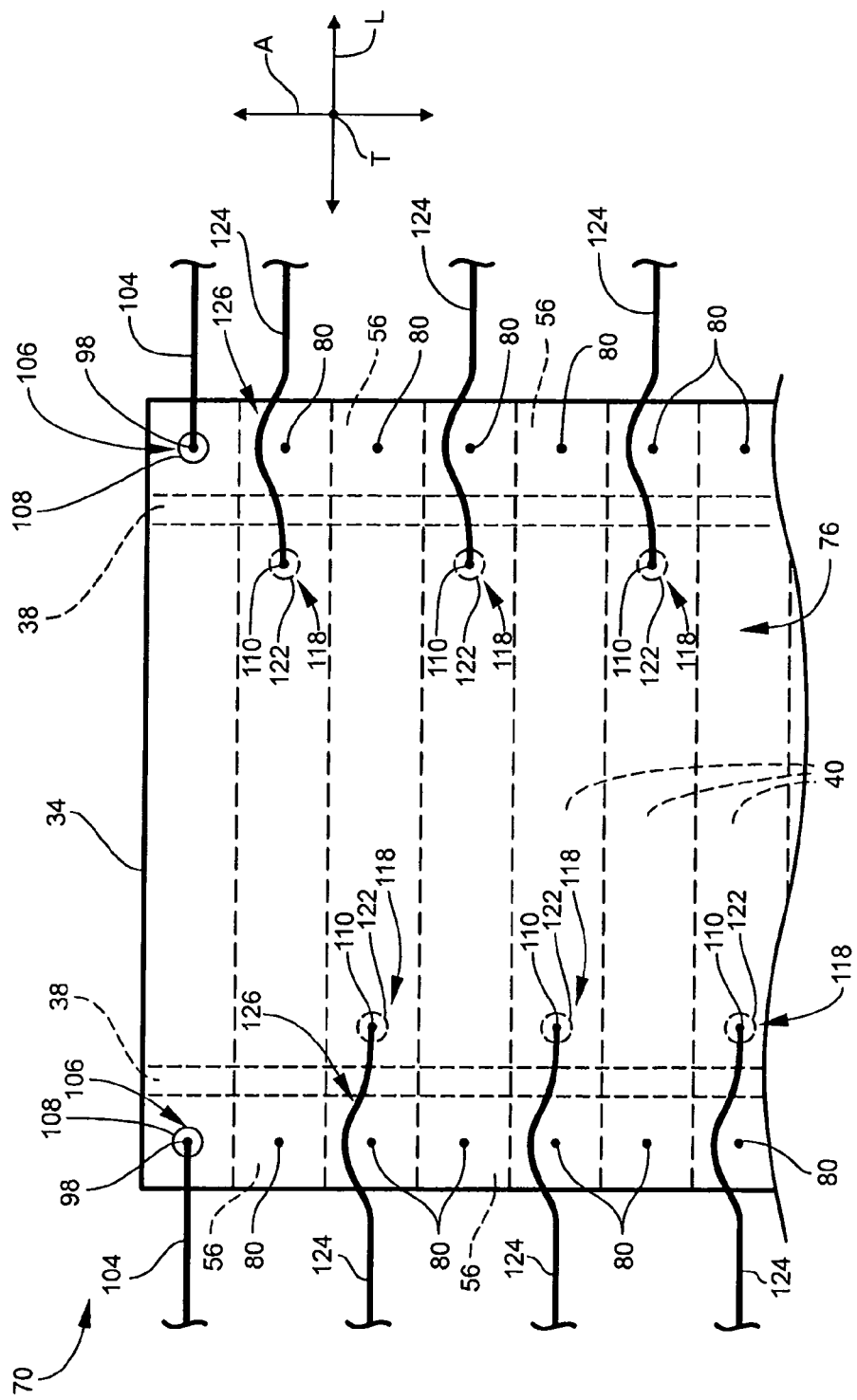
FIG. 4 is a top plan cross-sectional view of at least one additional layer of one embodiment of a circuit described herein, viewed along line 4-4 in FIG. 2.

FIG. 4 is a top plan cross-sectional view of the at least one additional layer 76 of the circuit 70 of FIG. 2, as viewed in the direction of the arrows associated with line 4-4 in FIG. 2. Individual transducer elements 56 of the N×1 transducer element array 34 defined by cuts 128 in the longitudinal direction of the piezoelectric ceramic material would be occluded by the at least one additional layer 76 in the presently illustrated view but are shown for reference purposes. Similarly, discontinuous regions 38 in the plating material 36 would also be occluded by the first layer 74, but are shown for reference purposes.

The at least one additional layer 76 of the circuit 70 comprises ground vias 98 extending therein from the ground layer 78 as described herein. The ground vias 98 are operable to connect grounds 90, 92 (not shown) of the ground layer 78 to an external circuit, such as that of an ultrasound system. In the at least one additional layer 76, a conductor 104 can be operatively connected to a second end 106 of the ground via 98. The second end 106 may include a connection pad 108 or other suitable structure to facilitate operative connection. The conductor 104 can extend generally in the longitudinal direction L to outside the circuit 70. The conductor 104 can be operatively connected to a cable assembly (not shown) that can carry electrical signals to an ultrasound system (not shown).

The circuit 70 can include a plurality of second vias 110. In the non-limiting embodiments illustrated in FIGS. 2-5 herein, the plurality of second vias 110 extend from the first layer 74 of the circuit 70 and into a depth of the at least one additional layer 76. The plurality of second vias 110 can be provided such that each second via 110 can be aligned with a positive electrode of respective one of the transducer elements 56. In some embodiments, for example, the second vias 110 are inboard of the discontinuous regions 38. Thus, each of the second vias 110 can be in line with a respective one of the positive electrodes 40 the transducer elements 56 when the circuit 70 is interfaced with the transducer element array 34.

The plurality of second vias 110 can be distributed in any suitable manner not inconsistent with the objectives of the present invention. In some embodiments, the second vias 110 can be provided in a staggered arrangement, the staggered arrangement comprising a first subset 110' of the second vias 110 alternating with a second subset 110" of the second vias 110, as is shown in FIG. 3. Each of the second vias 110 in the first subset 110' can be provided proximate to a first longitudinal end 112 of the positive electrode 40 of a respective one of the transducer elements 56. Each of the second vias 110 in the second subset 110" can be provided proximate to a second longitudinal end 114 of the positive electrode 40 of a respective one of the transducer elements 56. Such a staggered arrangement can be convenient for avoiding overcrowding of individual traces from the circuit 70. Moreover, as described herein, second vias 110 can be terminated in different layers of the circuit 70 to mitigate or avoid overcrowding.

However, embodiments are not limited to an arrangement in which the plurality of second vias 110 is staggered. For instance, the second plurality of vias 110 can be substantially aligned in the axial direction A. Thus, it will be appreciated that the plurality of second vias 110 can be provided in any suitable location and arranged in any suitable manner with respect to the transducer elements 56.

As illustrated in FIGS. 2-4, each of the second vias 110 can have a first end 116 and a second end 118. The first ends 116 of the second vias 110 are operable to receive positive electrodes 40 of individual transducer elements 56. The first ends 116 of the plurality of second vias 110 can include connection pads 120 (FIG. 3) and/or other features to facilitate operative connection to another item, such as one of the positive electrodes 40 of the transducer elements 56.

In the embodiment of FIG. 4, the second ends 118 of the second vias 110 terminate within the at least one additional layer 76. The second ends 118 of the second vias can include connection pads 122 and/or other features to facilitate operative connection to another item. In some embodiments, conductors or traces 124 can be operatively connected to second ends 118 of the second vias 110. The conductors or traces 124 can extend generally in the longitudinal direction L within the second layer 76. In some embodiments, one or more conductors or traces 124 can include a jog portion 126 that extends around the first via 80 on the same transducer element 56 to prevent electrical shorting. The jog portion 126 can have any suitable configuration so long as the conductor 124 avoids contact with the first vias 80. The conductors or traces 124 can be operatively connected to a cable assembly (not shown) that can carry electrical signals to an ultrasound system (not shown).

Figure 6:
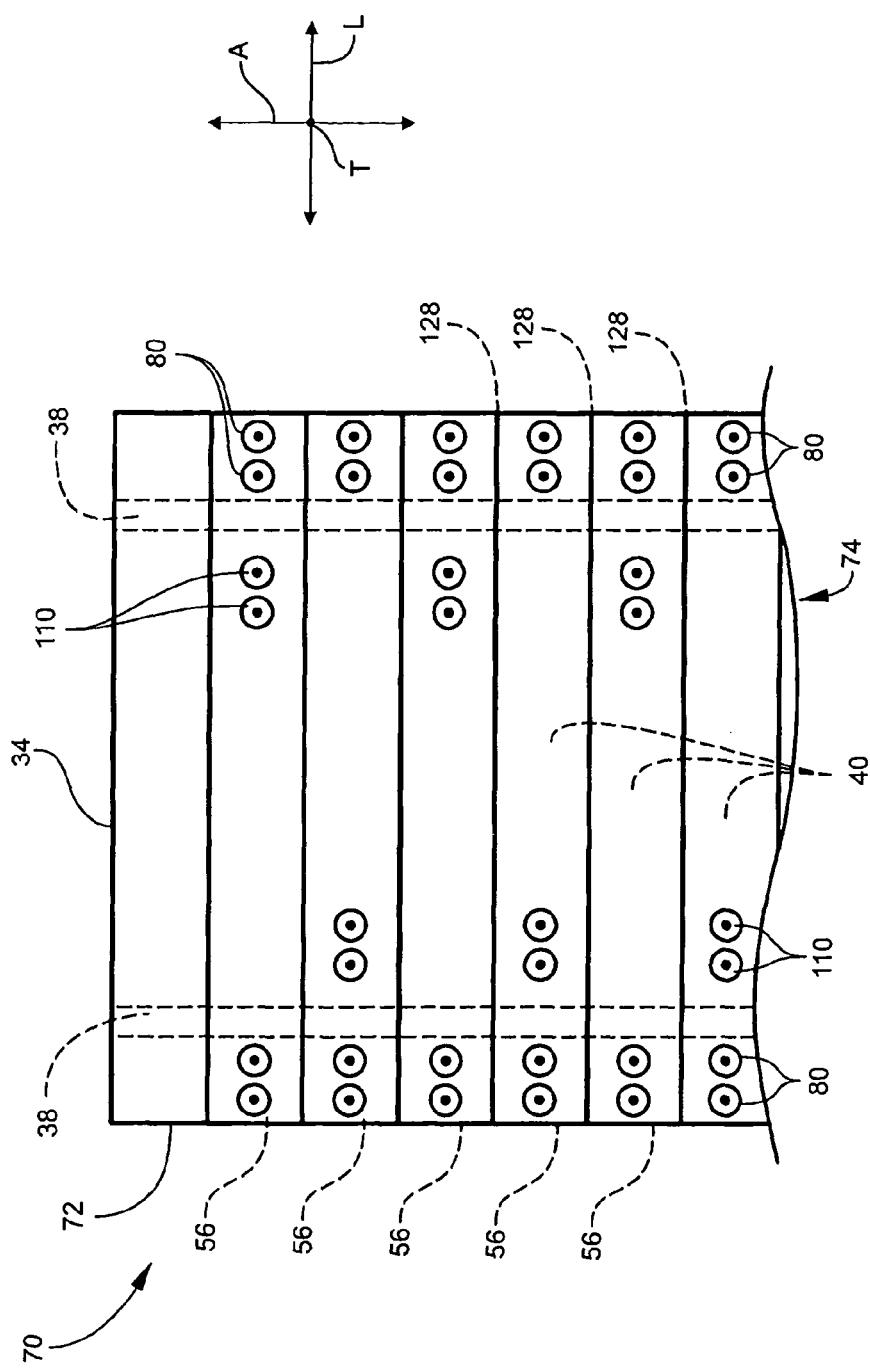
FIG. 6 is a top plan cross-sectional of a first layer of one embodiment of a circuit described herein, showing an arrangement in which vias are provided in pairs.

In some embodiments, it may be beneficial to configure the first, second and/or ground vias to minimize problems that would be caused if one or more of the vias 80, 98, 110 were to break or malfunction. For example, redundancy can be introduced into the system so that additional vias are provided in at least some locations. To that end, at least some of the vias 80, 98 and/or 110 can be provided in pairs or in triplets. An example of an arrangement in which pairs of vias are provided is shown in FIG. 6.

As described herein, in some embodiments, a transducer element array of an ultrasonic transducer system comprises a piezoelectric material separated into N transducer groups in the axial direction and M transducer elements in the longitudinal direction transverse to the axial direction to provide an N×M array.

Figure 7:
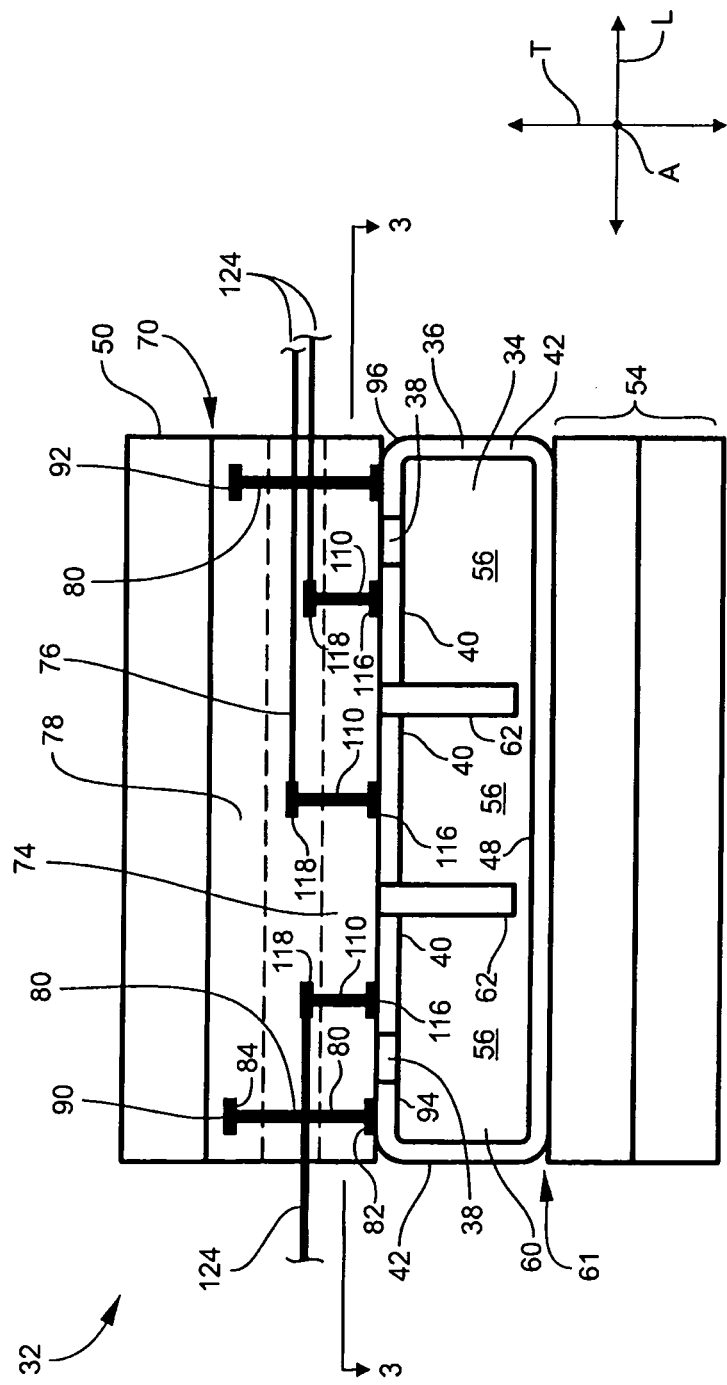
FIG. 7 is a side elevation cross-sectional view of a transducer system according to one embodiment described herein.

FIG. 7 illustrates a side elevation cross-sectional view of a transducer system according to one embodiment described herein. The ultrasonic transducer system 32 of FIG. 8 comprises an N×M transducer element array 34. The transducer element array 34 comprises a piezoelectric ceramic material 60 separated into N transducer element groups 61 in the axial direction and M transducer elements 56 in the longitudinal direction transverse to the axial direction to provide the N×M array. As FIG. 7 is a side cross-sectional view of the transducer system 32, the cross-section of a single transducer element group 61 comprising M=3 transducer elements 56 in the longitudinal direction of the array 34 in conjunction with the section of circuitry 70 associated with the transducer elements 56 is shown. The remaining transducer element groups 61 of the array 34 and associated circuitry 70 having similar construction extend along the axial direction.

The piezoelectric ceramic material 60 of the transducer element array 34 comprises an electrically conducting plating material 36 wrapped therearound. A plurality of cuts 62 are provided in the plating material 36 and the piezoelectric ceramic material 60 to define 3 transducer elements 56 in the longitudinal direction of the single axial transducer group 61 illustrated. In the embodiment of FIG. 7, the cuts do not pass through the plating material 36 on the opposing or lower side 48 of the piezoelectric ceramic material. Moreover, the plating material 36 is discontinuous at regions 38. The cuts 62 in the plating material 36 in conjunction with the discontinuous regions 38 define positive electrodes 40 for the M=3 transducer elements 56 of the axial transducer group 61.

The remaining portion of the plating material 61 defines a ground electrode 42 for each of the M=3 transducer elements 56. The ground electrode 42 can extend about a portion of an upper side of the transducer group 61, over side walls and across a lower side 48 of the transducer group 61.

Alternatively, in some embodiments, the plating material 36 is selectively deposited on regions of the piezoelectric ceramic material 60 between the cuts 62 to define the positive electrodes 40 and the ground electrode 42 of the transducer elements 56. Selective deposition of the plating material 36, in some embodiments, is achieved by masking and/or other lithographic, chemical etching or ion etching techniques.

The ultrasonic transducer system 32 of FIG. 7 also comprises a circuit 70 interfaced with the transducer element array 34. As with the transducer element array 34, the circuit 70 has an associated axial direction A, a longitudinal direction L that is transverse to the axial direction A and thickness direction T.

In the embodiment of FIG. 7, the circuit 70 comprises a first layer 74 for receiving or interfacing with the transducer element array 34 and a ground layer 78 over the first layer 74, the ground layer comprising a first ground 90 and a second ground 92. Although two grounds 90, 92 are illustrated in the embodiment of FIG. 7, circuits comprising a single ground or more than two grounds in the ground layer are contemplated herein. At least one additional layer 76 is disposed between the first layer 74 and the ground layer 78. In the embodiment of FIG. 7, a backer 50 is coupled to the circuit 70 and can provide structural rigidity to the circuit 70.

In some embodiments, at least one of the first and second grounds is provided on an exterior surface of the ground layer 78, as opposed to within the ground layer 78. In some embodiments, for example, at least one of the first 90 and second 92 grounds is disposed on the exterior surface of the ground layer 78 interfacing with the at least one additional layer 76. In some embodiments, at least one of the first 90 and second 92 grounds is disposed on the exterior surface of the ground layer interfacing with the backer 50.

The circuit 70 comprises first vias 80 extending through the first layer 74 and the at least one additional layer 76 to the first 90 and second 92 grounds of the ground layer 78. The first vias 80 comprise first ends 82 electrically connected to the ground electrode 42 of the transducer elements 56 of the transducer group 61 and second ends 84 electrically connected to the first 90 and second grounds 92. Although two first vias 80 and two grounds 90, 92 are illustrated in FIG. 7, embodiments described herein contemplate use of a single first via 80 in the circuit 70 to electrically connect the ground electrode 42 of transducer elements 56 to a single ground 90 of the ground layer 78.

Moreover, in the embodiment illustrated in FIG. 7, first vias 80 extend in a vertical direction normal to layers of the circuit 70. In some embodiments, first vias 80 can extend at one or more angles non-normal to layers of the circuit 70. In some embodiments, first vias 80 can extend laterally through one more layers of the circuit 70 in additional to vertically.

The circuit 70 illustrated in FIG. 7 further comprises second vias 110 extending through the first layer 74. The second vias 110 comprise first ends 116 electrically connected to the positive electrode 40 of each of the transducer elements 56 of the transducer group 61. The second vias 110 terminate in the at least one additional layer 76, and the second ends 118 of the second vias are electrically connected to conductors or traces 124 in electrical communication with external circuitry, such as that of an ultrasound system. As described herein, the second vias can pass through the first layer and terminate in any layer over the first layer. In the embodiment of FIG. 7, for example, the first vias 110 can also terminate in the ground layer 78. In some embodiments, a first number of second vias terminate in a different layer of the circuit than a second number of the second vias to inhibit or prevent overcrowding.

In the embodiment of FIG. 7, the conductors or traces 124 extend in the longitudinal direction (L) of the circuit 70 to the exterior of the at least one additional layer 76 where the traces 124 can be electrically connected to external circuitry, such as that of an ultrasound system.

Figure 8:
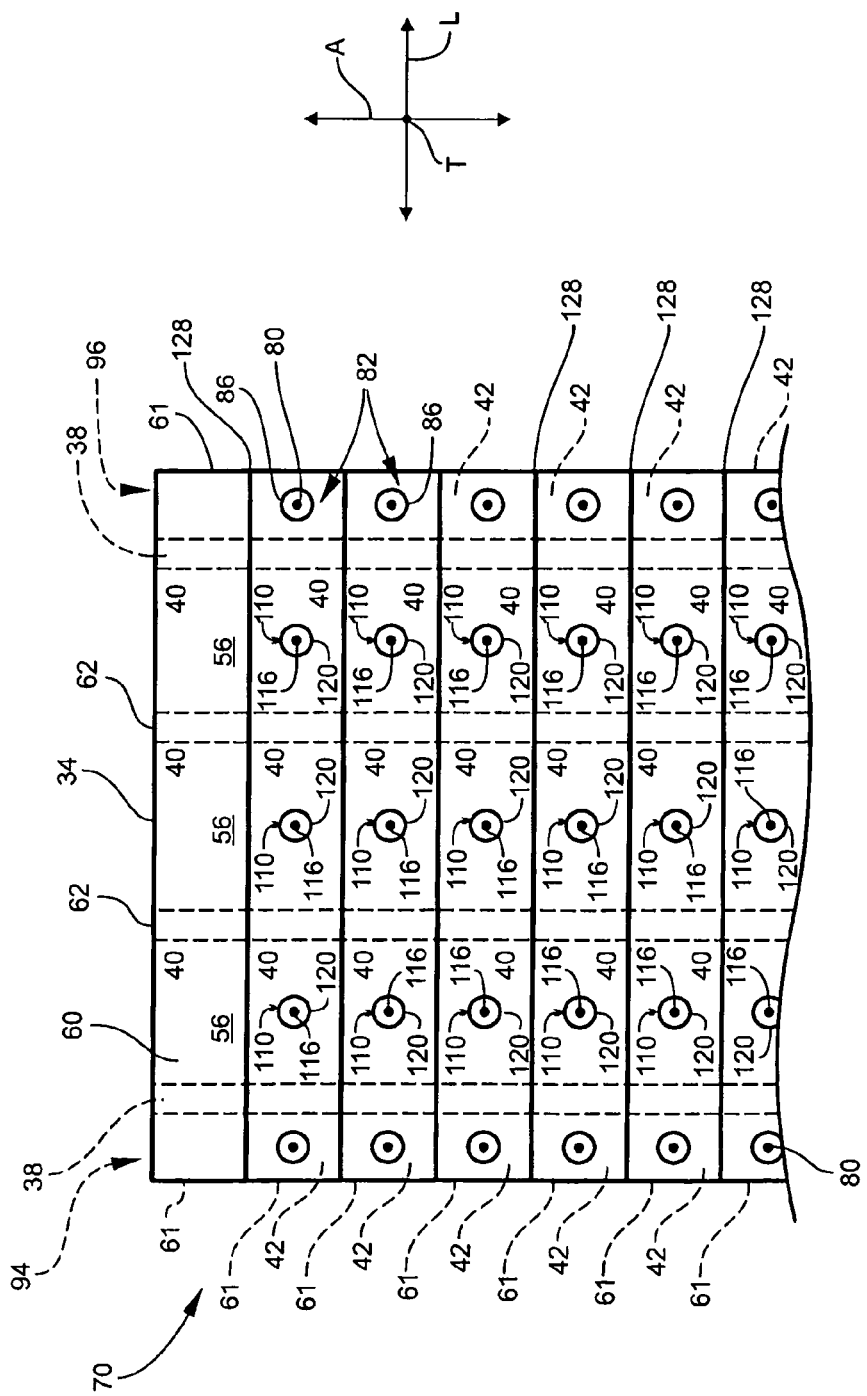
FIG. 8 is a top plan cross-sectional view of a first layer of an embodiment of a circuit described herein, viewed along line 3-3 in FIG. 7.

FIG. 8 is a top plan cross-sectional view of the first layer 74 of the circuit 70 of FIG. 7 viewed along line 3-3 in FIG. 7. Individual transducer groups 61 of the N×M transducer element array 34 defined by cuts 128 in the longitudinal direction of the piezoelectric ceramic material 60 would be occluded by the first layer 74 in the presently illustrated view but are shown for reference purposes. Similarly, the M=3 transducer elements 56 of each transducer group 61 defined but cuts 62 and the associated ground 42 and positive electrodes 40 would also be occluded by the first layer 74, but are shown for reference purposes.

A plurality of first vias 80 can extend through the first layer 74, through the at least one additional layer 76 and into the ground layer 78 (not shown). The plurality of first vias 80 can be formed in the circuit 70 such that each of the first vias 80 can be outboard of the discontinuous regions 38. In other words, each of the plurality of first vias 80 can be aligned with a respective one of the ground electrodes 42 of the transducer elements 56 when the circuit 70 is disposed on the transducer element array 34, as shown in FIG. 8.

In some embodiments, there can be at least two first vias 80 associated with each ground electrode 42 of the transducer element group 61. For example, one of the first vias 80 can be associated with a first longitudinal end portion 94 of the ground electrode 42, and another one of the first vias 80 can be associated with a second longitudinal end portion 96 of the ground electrode 42. The first vias 80 can be substantially aligned in the axial direction A along the first and second longitudinal end portions 94, 96 of the ground electrodes 42, as is shown in FIG. 8. While not shown in FIG. 8, one or more of the first vias 80 can be offset from the other first vias 80 in the axial direction A.

As in FIG. 7, each of the plurality of first vias 80 can have a first end 82 and a second end 84. The first ends 82 of the first vias 80 can be adapted to facilitate operative connection to the ground electrodes 42 of the transducer groups 61. In some embodiments, for example, the first ends 82 of the first vias 80 can include connection pads 86. The second ends 84 of the first vias 80 can terminate within or external to the ground layer 78. The second ends 84 of the first vias 80 can be adapted to facilitate operative connection to one or more of grounds in the ground layer 78. In some embodiments, for example, the second ends 84 of the first vias 80 can include connection pads.

The circuit 70 further comprises a plurality of second vias 110. As illustrated in FIGS. 7-8, the second vias 110 are aligned with the positive electrodes 40 of the M=3 transducer elements 56 of the transducer element groups 61. The second vias comprise first ends 116 electrically connected to the positive electrodes 40 of the transducer elements 56. Moreover, in the embodiment illustrated in FIG. 8, the second vias 110 comprise connection pads and/or other structures 120 operable to facilitate electrical connection with the positive electrodes 40 of the transducer elements 56.

The circuit 70 can include a plurality of second vias 110. In the non-limiting embodiments illustrated in FIGS. 2-8 herein, the plurality of second vias 110 extend from the first layer 74 of the circuit 70 and into a depth in the at least one additional layer 76. The plurality of second vias 110 can be provided such that each second via 110 can be aligned with a positive electrode of respective one of the transducer elements 56. In some embodiments, for example, the second vias 110 are inboard of the discontinuous regions 38. Thus, each of the second vias 110 can be in line with a respective one of the positive electrodes 40 the transducer elements 56 when the circuit 70 is interfaced with the transducer element array 34.

In another aspect, methods of making transducer assemblies are described herein. In some embodiments, a method of making a transducer assembly comprises providing a piezoelectric element partially covered with a plating material defining a ground electrode and at least one positive electrode and providing a circuit comprising a first layer for receiving the piezoelectric element, a ground layer comprising at least one ground disposed over the first layer and a plurality of first vias extending through the first layer to the at least one ground and comprising first ends for receiving the ground electrode of the piezoelectric element and second ends electrically connected to the at least one ground. The first layer of the circuit is interfaced with the piezoelectric element and the first ends of the first vias are placed in electrical communication with the ground electrode of the piezoelectric element. A plurality of cuts are made in the piezoelectric element having a depth passing through the piezoelectric element, plating material and first layer of the circuit and terminating prior to reaching the ground of the ground layer. The cuts provide separated transducer elements in the axial direction, the transducer elements comprising individual ground electrodes and positive electrodes, wherein the individual ground electrodes are connected to one another through the first vias in electrical communication with the at least one ground of the ground layer, thereby obviating the need to reconnect the ground electrodes with further processing subsequent to the dicing operation.

In some embodiments of methods of making a transducer assembly, the piezoelectric element is provided with a plurality of cuts in the axial direction, the cuts terminating prior to the ground electrode on the opposing side of the piezoelectric element and providing M separated transducer elements in the longitudinal direction transverse to the axial direction. In some embodiments wherein the piezoelectric element is provided with M separated transducer elements in the longitudinal direction, the cuts made in the piezoelectric element having a depth passing through the piezoelectric element, plating material and first layer of the circuit and terminating prior to reaching the ground of the ground layer, provide in the axial direction N separated groups of the M transducer elements.

In some embodiments of methods of making a transducer assembly, a circuit described herein is fabricated independently from the piezoelectric element comprising the plating material and subsequently interfaced with the piezoelectric element. In some embodiments of methods of making a transducer assembly, a circuit described herein is interfaced with the piezoelectric element comprising the plating material by fabricating the circuit directly on the piezoelectric element.

A non-limiting example of a method of making a transducer assembly described herein is now provided with reference to FIGS. 2-5. A piezoelectric ceramic material comprising electrically conductive plating material and discontinuous regions 38 defining a positive electrode 40 and ground electrode 42 can be formed in any suitable manner. Additionally, one or more matching layers 54 can be attached to one side of the piezoelectric ceramic material in any suitable manner. In some embodiments, the matching layers 54 can improve acoustic energy transmission efficiency A circuit 70 is interfaced with the side of the piezoelectric ceramic material comprising discontinuous regions 38. The first ends 82 of the first vias 80 of the circuit 70 can be operatively connected to the ground electrode 42 of the piezoelectric ceramic material in any suitable manner. For instance, the first end 82 of each first via 80 can be operatively connected to the ground electrode 42 by epoxy or other suitable adhesive and/or by physical engagement between the first vias 80 and the ground electrode 42.

Moreover, the first ends 116 of the second vias 110 can be operatively connected to the positive electrode 40 of the piezoelectric ceramic material. In some embodiments, a backer 50 operable to provide structural integrity to the transducer system 32 is attached to the circuit 70.

Individual transducer elements 56 are formed from the piezoelectric ceramic material by making a plurality of parallel dices or cuts 128 in the transducer assembly 32, as shown in FIGS. 2-4. Such cuts can be formed using a dicing saw (not shown) or other suitable cutting device. The dicing saw can be brought into contact with the assembly from the patient side of the assembly 32, that is, from the matching layer 54 side of the assembly. Thus, the dicing saw can cut through the one or more matching layers 54, through the plating material 36, through the piezoelectric material 34, and into the circuit 70. The dicing saw can penetrate the first and at least one additional layers 74, 76 of the circuit 70, terminating prior to the grounds 90, 92 of the ground layer 78. After the dicing operation, kerf filler (not shown) can be placed in the cuts 128 to provide structural support to the diced assembly.

Significantly, as the cuts terminate prior to the grounds 90, 92 of the ground layer 78 of the circuit 70, a common ground connection by way of the grounds 90, 92 is maintained between the newly formed transducer elements 56 having individual or discrete ground electrodes 42. Therefore, in some embodiments, no subsequent operation of reconnecting separated ground electrodes 42 of the transducer elements 56 is required.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. An ultrasonic transducer system comprising:
an array comprising a plurality of piezoelectric transducer elements, the piezoelectric transducer elements comprising individual positive electrodes and individual ground electrodes; and
a circuit coupled to the array, the circuit comprising a first layer for receiving the array, a layer comprising at least one ground disposed above the first layer and a plurality of first vias corresponding to piezoelectric transducer elements of the array, the first vias extending through the first layer to the at least one ground and comprising first ends electrically connected to the individual ground electrodes of the piezoelectric transducer elements and second ends electrically connected to the ground.

2. The ultrasonic transducer system of claim 1, wherein the circuit further comprises second vias corresponding to piezoelectric transducer elements of the array, the second vias extending through the first layer and comprising first ends electrically coupled to positive electrodes of the piezoelectric transducer elements and second ends electrically connected to one or more traces in electrical communication with circuitry external to the circuit.

3. The ultrasonic transducer system of claim 2, wherein at least one second via is associated with each piezoelectric transducer element of the array.

4. The ultrasonic transducer system of claim 1, wherein at least one first via is associated with each piezoelectric transducer element of the array.

5. The ultrasonic transducer system of claim 1, wherein the array comprises N transducer groups in an axial direction with each group comprising M piezoelectric transducer elements.

6. The ultrasonic transducer system of claim 5, wherein N is selected from the group consisting of 64, 96, 128, 192, 256, 320, 384, 448 and 512 and M is selected from the group consisting of 1, 3, 5, 7, 9 and 11.

7. The ultrasonic transducer system of claim 5, wherein at least one first via is provided for each of the N transducer groups of the array, the first end of the first via electrically connected to a ground electrode for the M piezoelectric transducer elements of the group and the second end of the first via electrically connected to the continuous ground.

8. The ultrasonic transducer system of claim 7, wherein second vias are provided for each of the M piezoelectric transducer elements of the N transducer groups.

9. The ultrasonic transducer system of claim 5, wherein the array is a curved array.

10. The ultrasonic transducer system of claim 5, wherein the array is a Tightly curved array.

* * * * *